(12) United States Patent
Yoon (10) Patent No.: US 9,773,568 B2
(45) Date of Patent: Sep. 26, 2017

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventor: Young Jun Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 139 days.

(21) Appl. No.: 14/690,558

(22) Filed: Apr. 20, 2015

(65) Prior Publication Data

US 2016/0197606 A1 Jul. 7, 2016

(30) Foreign Application Priority Data

Jan. 5, 2015 (KR) ........................ 10-2015-0000487

(51) Int. Cl.
*H03B 1/00* (2006.01)
*G11C 29/02* (2006.01)
*G01R 31/317* (2006.01)

(52) U.S. Cl.
CPC ...... *G11C 29/022* (2013.01); *G01R 31/31715* (2013.01)

(58) Field of Classification Search
CPC ........ G01R 31/3177; G01R 31/318536; G01R 31/318572; G01R 31/318552; G01R 31/318555
See application file for complete search history.

(56) References Cited

U.S. PATENT DOCUMENTS

| 2007/0053230 A1* | 3/2007 | Kanno | ................. | G11C 17/143 365/200 |
| 2007/0126466 A1* | 6/2007 | Kim | ....................... | G11C 29/02 326/30 |
| 2014/0223389 A1* | 8/2014 | Liao | ............... | G01R 31/318558 716/52 |

FOREIGN PATENT DOCUMENTS

| KR | 1020130007119 A | 1/2013 |
| KR | 1020140064461 A | 5/2014 |

* cited by examiner

*Primary Examiner* — Sibin Chen
(74) *Attorney, Agent, or Firm* — William Park & Associates Ltd.

(57) ABSTRACT

The semiconductor device includes a first drive control signal generator suitable for generating a first drive control signal from a test input signal, a first output driver suitable for being controlled according to the first drive control signal, a second drive control signal generator suitable for generating a second drive control signal from the first drive control signal, and a second output driver suitable for being controlled according to the second drive control signal.

25 Claims, 5 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2015-0000487, filed on Jan. 5, 2015, in the Korean Intellectual Property Office, which is incorporated herein by reference in its entirety as set forth in full.

BACKGROUND

1. Technical Field

Embodiments of the invention relate to semiconductor devices and semiconductor systems including the same.

2. Related Art

A system-in-package (SiP) technique and a chip-on-chip (CoC) technique have been widely used as packaging techniques for putting a large capacity of memory chip and a controller chip in a single package. The system-in-package (SiP) technique may use a wire bonding process to electrically connect a plurality of chips to each other. The chip-on-chip (CoC) technique may be a packaging technique which is suitable for increase of a memory capacity in a single package and for improvement of a data transmission speed between the memory chip and the controller chip in a single package. This is because the memory chip and the controller chip in the package communicate with each other through micro-bump pads.

The micro-bump pads may exhibit an excellent resistance characteristic, an excellent inductance characteristic and an excellent parasitic capacitance characteristic to allow the packages to operate at a high frequency. Thus, a data transmission speed may be improved by increasing the number of the micro-bump pads employed in the package. In the chip-on-chip (CoC) package, each of the memory chip and the controller chip may be fabricated to include the micro-bump pads, and the micro-bump pads of the memory chip may be combined with the micro-bump pads of the controller chip to produce a single unified chip including the memory chip and the controller chip.

In semiconductor memory devices, test operations may be executed to verify the functions of buffers or drivers through which data are inputted or outputted. When semiconductor packages fabricated using the chip-on-chip (CoC) technique are tested, data may be inputted or outputted through the micro-bump pads of the semiconductor packages.

SUMMARY

According to an embodiment, a semiconductor device includes a first drive control signal generator suitable for generating a first drive control signal from a test input signal. The semiconductor device may also include a first output driver suitable for being controlled according to the first drive control signal. Further, the semiconductor device may include a second drive control signal generator suitable for generating a second drive control signal from the first drive control signal. In addition, the semiconductor device may include a second output driver suitable for being controlled according to the second drive control signal.

According to an embodiment, a semiconductor system includes an integrated circuit and a semiconductor device. The integrated circuit generates and outputs command signals, a clock signal and a test input signal. In addition, the integrated circuit receives or outputs a plurality of transmission signals. The semiconductor device sequentially generates a first drive control signal and a second drive control signal from the test input signal during a test operation executed according to the command signals and the clock signal. The semiconductor device includes a first output driver controlled according to the first drive control signal and a second output driver controlled according to the second drive control signal.

In an embodiment, a semiconductor device includes a first drive control signal generator configured to output a first selection signal as a first drive control signal in synchronization with a test clock signal. The semiconductor device also includes a first output driver electrically coupled to a first pad and configured to have an operation controlled according to the first drive control signal. Further, the semiconductor device includes a second drive control signal generator configured to generate a second drive control signal in response to the first drive control signal when a test enablement signal and the test clock signal are inputted. The semiconductor device also includes a second output driver electrically coupled to a second pad and configured to have an operation controlled according to the second drive control signal.

DETAILED DESCRIPTION

Various embodiments of the invention will be described with reference to the accompanying figures. However, the embodiments described are for illustrative purposes only and are not intended to limit the scope of the invention. Various embodiments are directed to semiconductor devices providing a test mode for verifying functions of a plurality of output drivers and semiconductor systems including the same.

Figure 1:
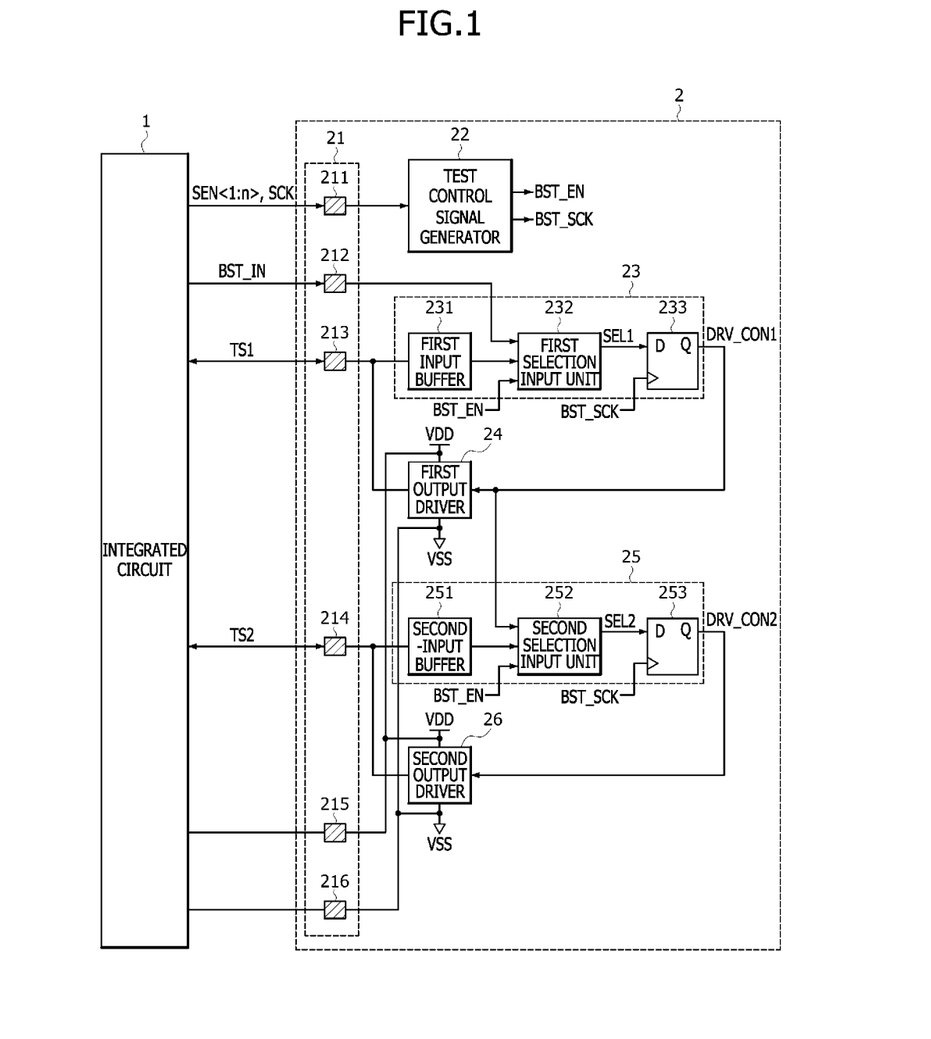
FIG. 1 is a block diagram illustrating a semiconductor system according to an embodiment of the invention.

Referring to FIG. 1, a semiconductor system according to an embodiment may be configured to include an integrated circuit 1 and a semiconductor device 2. The integrated circuit 1 may output command signals SEN<1:n>, a clock signal SCK, and a test input signal BST_IN. In addition, the integrated circuit 1 may receive a first transmission signal TS1 and a second transmission signal TS2 from the semiconductor device 2 or may output the first and second transmission signals TS1 and TS2 to the semiconductor device 2. The semiconductor device 2 may include a pad unit 21, a test control signal generator 22, a first drive control signal generator 23, a first output driver 24, a second drive control signal generator 25, and a second output driver 26.

The pad unit 21 may include a first pad 211, a second pad 212, a third pad 213, a fourth pad 214, a fifth pad 215 and a sixth pad 216. The first pad 211 may receive the command signals SEN<1:n> and the clock signal SCK outputted from the integrated circuit 1. The second pad 212 may receive the test input signal BST_IN outputted from the integrated circuit 1. The first transmission signal TS1 may be transmitted from the integrated circuit 1 to the third pad 213. The first transmission signal TS1 may also be transmitted from the third pad 213 to the integrated circuit 1. The second transmission signal TS2 may be transmitted from the integrated circuit 1 to the fourth pad 214. The second transmission signal TS2 may also be transmitted from the fourth pad 214 to the integrated circuit 1. The fifth pad 215 may be electrically coupled to power supply voltage VDD terminals of the first and second output drivers 24 and 26. The sixth pad 216 may be electrically coupled to ground voltage VSS terminals of the first and second output drivers 24 and 26. The integrated circuit 1 may measure a current flowing through the fifth and sixth pads 215 and 216 to verify a normality/abnormality of the first output driver 24 while the first output driver 24 operates according to a first drive control signal DRV_CON1. Moreover, the integrated circuit 1 may measure a current flowing through the fifth and sixth pads 215 and 216 to verify a normality/abnormality of the second output driver 26 while the second output driver 26 operates according to a second drive control signal DRV_CON2.

The test control signal generator 22 may receive the command signals SEN<1:n> and the clock signal SCK through the first pad 211 to generate a test enablement signal BST_EN and a test clock signal BST_SCK. The test enablement signal BST_EN may be enabled to have a logic "high" level to execute a test operation capable of sequentially verifying a normality/abnormality of the first output driver 24 and a normality/abnormality of the second output driver 26. The test clock signal BST_SCK may be generated from the clock signal SCK while the test operation is executed. A logic level combination of the command signals SEN<1:n> for generating the test enablement signal BST_EN which is enabled and the test clock signal BST_SCK which is toggled may be set to be different according to various embodiments. The test control signal generator 22 may decode the command signals SEN<1:n> to generate the test enablement signal BST_EN.

The first drive control signal generator 23 may include a first input buffer 231, a first selection input unit 232, and a first latch unit 233. During a read operation, the first input buffer 231 may receive the first transmission signal TS1 through the third pad 213. The first input buffer 231 may also output the first transmission signal TS1 to the first selection input unit 232. The first selection input unit 232 may output the test input signal BST_IN received through the second pad 212 or an output signal of the first input buffer 231 as a first selection signal SEL1 according to the test enablement signal BST_EN. More specifically, the first selection input unit 232 may output the test input signal BST_IN as the first selection signal SEL1 if the test operation is executed. The first latch unit 233 may output the first selection signal SEL1 as the first drive control signal DRV_CON1 in synchronization with the test clock signal BST_SCK. The first drive control signal generator 23 may be realized to generate the first drive control signal DRV_CON1 enabled if the enabled test input signal BST_IN is inputted while the enabled test enablement signal BST_EN and the test clock signal BST_SCK are inputted in a test mode that the test operation is executed. Logic levels of the test enablement signal BST_EN and the test input signal BST_IN which are enabled may be set to be different according to various embodiments.

The first output driver 24 may be electrically coupled to the third pad 213. Further, an operation of the first output driver 24 may be controlled by the first drive control signal DRV_CON1. More specifically, if the first drive control signal DRV_CON1 is enabled, the first output driver 24 may pull up a voltage level of the third pad 213 to the power supply voltage VDD and may pull down a voltage level of the third pad 213 to the ground voltage VSS at the same time. A detailed configuration and a detailed operation of the first output driver 24 will be described with reference to FIG. 2 later.

The second drive control signal generator 25 may include a second input buffer 251, a second selection input unit 252, and a second latch unit 253. During the read operation, the second input buffer 251 may receive the second transmission signal TS2 through the fourth pad 214. The second input buffer 251 may also output the second transmission signal TS2 to the second selection input unit 252. The second selection input unit 252 may output the first drive control signal DRV_CON1 or an output signal of the second input buffer 251 as a second selection signal SEL2, in response to the test enablement signal BST_EN. More specifically, the second selection input unit 252 may output the first drive control signal DRV_CON1 as the second selection signal SEL2 if the test operation is executed. The second latch unit 253 may output the second selection signal SEL2 as the second drive control signal DRV_CON2 in synchronization with the test clock signal BST_SCK. The second drive control signal generator 25 may generate the second drive control signal DRV_CON2 enabled if the enabled first drive control signal DRV_CON1 is inputted while the enabled test enablement signal BST_EN and the test clock signal BST_SCK are inputted in a test mode that the test operation is executed.

The second output driver 26 may be electrically coupled to the fourth pad 214. Further, an operation of the second output driver 26 may be controlled by the second drive control signal DRV_CON2. More specifically, if the second drive control signal DRV_CON2 is enabled, the second output driver 26 may pull up a voltage level of the fourth pad 214 to the power supply voltage VDD and may pull down a voltage level of the fourth pad 214 to the ground voltage VSS at the same time. A detailed configuration and a detailed operation of the second output driver 26 will be described with reference to FIG. 3 later.

Figure 2:
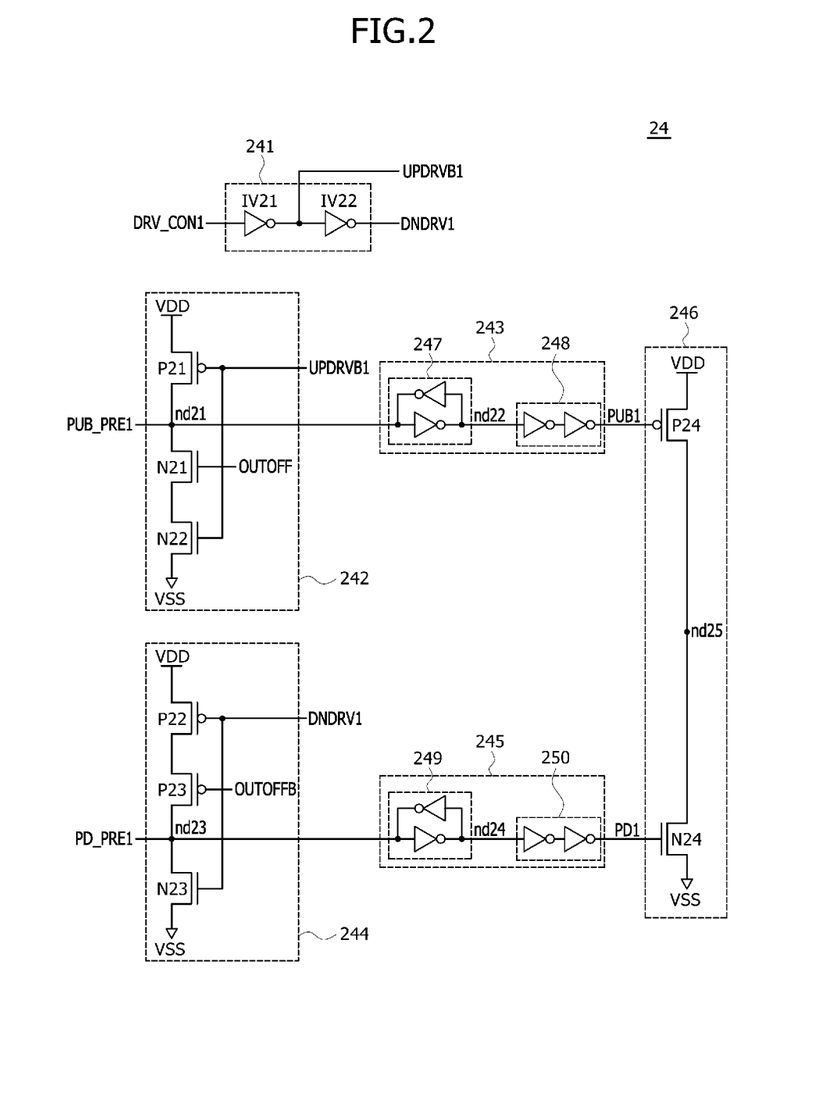
FIG. 2 is a circuit diagram illustrating a first output driver included in the semiconductor system of FIG. 1.

Referring to FIG. 2, the first output driver 24 may include a first buffer 241, a first input controller 242, a first pull-up signal generator 243, a second input controller 244, a first pull-down signal generator 245, and a first driver 246.

The first buffer 241 may include inverters IV21 and IV22 which are cascaded. The first buffer 241 may inversely buffer the first drive control signal DRV_CON1 to generate a first pull-up control signal UPDRVB1. In addition, the first buffer 241 may inversely buffer the first pull-up control signal UPDRVB1 to generate a first pull-down control signal DNDRV1. If the first drive control signal DRV_CON1 is enabled to have a logic "high" level when the test operation is executed, the first pull-up control signal UPDRVB1 may be enabled to have a logic "low" level and the first pull-down control signal DNDRV1 may be enabled to have a logic "high" level.

The first input controller 242 may include a PMOS transistor P21, an NMOS transistor N21, and an NMOS transistor N22 which are electrically coupled in series between the power supply voltage VDD terminal and the ground voltage VSS terminal. If the test operation is executed, the first input controller 242 may pull up a first input node ND21 receiving a first pre-pull-up signal PUB_PRE1 to the power supply voltage VDD according to the first pull-up control signal UPDRVB1 enabled to have a logic "low" level. The first pre-pull-up signal PUB_PRE1 may be generated by data outputted from a memory array of the semiconductor device 2 during the read operation. When both of the test operation and the read operation are not executed, the first input controller 242 may pull down the first input node ND21 to the ground voltage VSS according to the first pull-up control signal UPDRVB1 and a drive termination signal OUTOFF that have a logic "high" level. The drive termination signal OUTOFF may be set to have a logic "low" level during a predetermined period while the read operation is executed.

The first pull-up signal generator 243 may include a first latch unit 247 and a first buffer 248. The first latch unit 247 may receive and latch a signal of the first input node ND21. The first latch unit 247 may also output the latched signal through a node ND22. The first buffer 248 may buffer a signal of the node ND22 and may output the buffered signal as a first pull-up signal PUB1. The first pull-up signal generator 243 may generate the first pull-up signal PUB1 according to a signal of the first input node ND21. If the test operation is executed, the first pull-up signal generator 243 may receive a signal of the first input node ND21 having a logic "high" level to generate the first pull-up signal PUB1 enabled to have a logic "low" level.

The second input controller 244 may include a PMOS transistor P22, a PMOS transistor P23, and an NMOS transistor N23 electrically coupled in series between the power supply voltage VDD terminal and the ground voltage VSS terminal. If the test operation is executed, the second input controller 244 may pull down a second input node ND23 receiving a first pre-pull-down signal PD_PRE1 to the ground voltage VSS in response to the first pull-down control signal DNDRV1 enabled to have a logic "high" level. The first pre-pull-down signal PD_PRE1 may be generated by the data outputted from the memory array of the semiconductor device 2 during the read operation. When both of the test operation and the read operation are not executed, the second input controller 244 may pull up the second input node ND23 to the power supply voltage VDD in response to the first pull-down control signal DNDRV1 and a complementary drive termination signal OUTOFFB that have a logic "low" level. The complementary drive termination signal OUTOFFB may be set to have a logic "high" level during a predetermined period while the read operation is executed.

The first pull-down signal generator 245 may include a second latch unit 249 and a second buffer 250. The second latch unit 249 may receive and latch a signal of the second input node ND23. Further, the second latch unit 249 may output the latched signal through a node ND24. The second buffer 250 may buffer a signal of the node ND24 and may output the buffered signal as a first pull-down signal PD1. The first pull-down signal generator 245 may generate the first pull-down signal PD1 according to a signal of the second input node ND23. If the test operation is executed, the first pull-down signal generator 245 may receive a signal of the second input node ND23 having a logic "low" level to generate the first pull-down signal PD1 enabled to have a logic "high" level.

The first driver 246 may include a PMOS transistor P24 and an NMOS transistor N24 electrically coupled in series between the power supply voltage VDD terminal and the ground voltage VSS terminal. The PMOS transistor P24 may pull up a first output node ND25 to the power supply voltage VDD if the first pull-up signal PUB1 inputted to the PMOS transistor P24 is enabled to have a logic "low" level. The NMOS transistor N24 may pull down the first output node ND25 to the ground voltage VSS if the first pull-down signal PD1 inputted to the NMOS transistor N24 is enabled to have a logic "high" level. If the test operation is executed, the first driver 246 may receive the first pull-up signal PUB1 having a logic "low" level to pull up the first output node ND25 to the power supply voltage VDD. Further, the first driver 246 may receive the first pull-down signal PD1 having a logic "high" level to pull down the first output node ND25 to the ground voltage VSS at the same time. If the test operation is executed, the PMOS transistor P24 acting as a pull-up element and the NMOS transistor N24 acting as a pull-down element may be simultaneously turned on.

Figure 3:
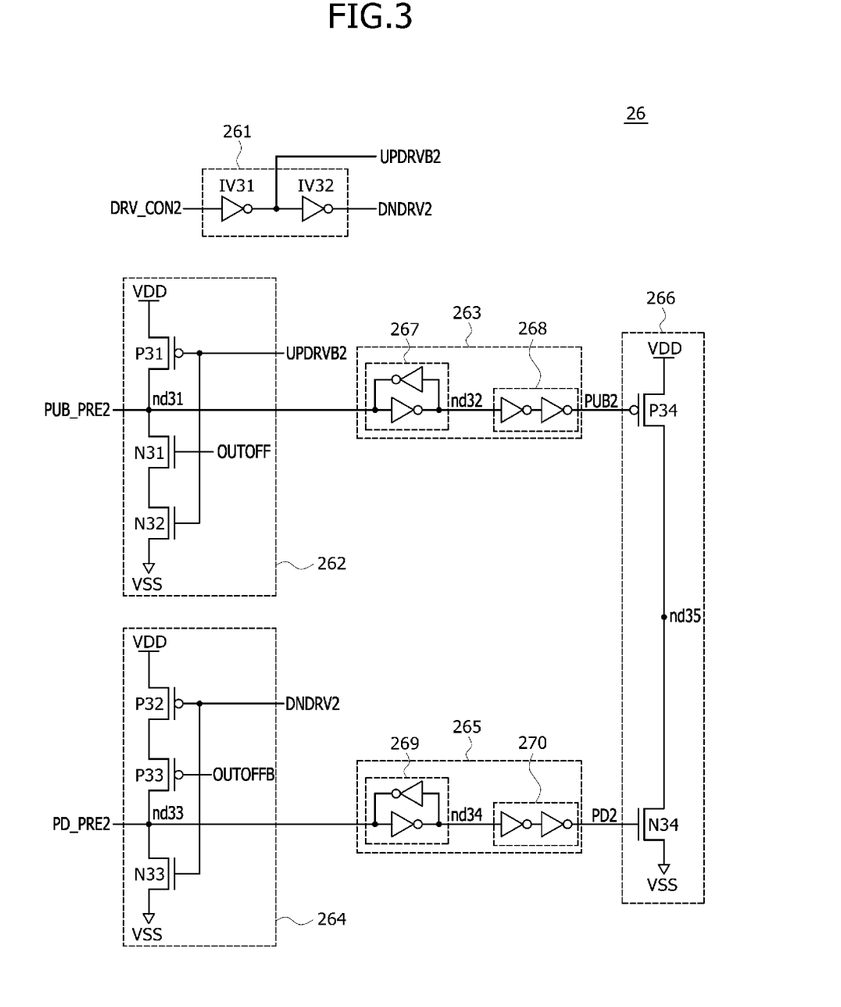
FIG. 3 is a circuit diagram illustrating a second output driver included in the semiconductor system of FIG. 1.

Referring to FIG. 3, the second output driver 26 may include a second buffer 261, a third input controller 262, a second pull-up signal generator 263, a fourth input controller 264, a second pull-down signal generator 265, and a second driver 266.

The second buffer 261 may include inverters IV31 and IV32 which are cascaded. The second buffer 261 may inversely buffer the second drive control signal DRV_CON2 to generate a second pull-up control signal UPDRVB2. In addition, the second buffer 261 may inversely buffer the second pull-up control signal UPDRVB2 to generate a second pull-down control signal DNDRV2. If the second drive control signal DRV_CON2 is enabled to have a logic "high" level when the test operation is executed, the second pull-up control signal UPDRVB2 may be enabled to have a logic "low" level. Further, the second pull-down control signal DNDRV2 may be enabled to have a logic "high" level.

The third input controller 262 may include a PMOS transistor P31, an NMOS transistor N31, and an NMOS transistor N32 electrically coupled in series between the power supply voltage VDD terminal and the ground voltage VSS terminal. If the test operation is executed, the third input controller 262 may pull up a third input node ND31 receiving a second pre-pull-up signal PUB_PRE2 to the power supply voltage VDD according to the second pull-up control signal UPDRVB2 enabled to have a logic "low" level. The second pre-pull-up signal PUB_PRE2 may be generated by data outputted from the memory array of the semiconductor device 2 during the read operation. When both of the test operation and the read operation are not executed, the third input controller 262 may pull down the third input node ND31 to the ground voltage VSS according to the second pull-up control signal UPDRVB2 and the drive termination signal OUTOFF that have a logic "high" level. The drive termination signal OUTOFF may be set to have a logic "low" level during a predetermined period while the read operation is executed.

The second pull-up signal generator 263 may include a third latch unit 267 and a third buffer 268. The third latch unit 267 may receive and latch a signal of the third input node ND31. Further, the third latch unit 267 may output the latched signal through a node ND32. The third buffer 268 may buffer a signal of the node ND32 and may output the buffered signal as a second pull-up signal PUB2. The second pull-up signal generator 263 may generate the second pull-up signal PUB2 in response to a signal of the third input node ND31. If the test operation is executed, the second pull-up signal generator 263 may receive a signal of the third input node ND31 having a logic "high" level to generate the second pull-up signal PUB2 enabled to have a logic "low" level.

The fourth input controller 264 may include a PMOS transistor P32, a PMOS transistor P33, and an NMOS transistor N33 electrically coupled in series between the power supply voltage VDD terminal and the ground voltage VSS terminal. If the test operation is executed, the fourth input controller 264 may pull down a fourth input node ND33 receiving a second pre-pull-down signal PD_PRE2 to the ground voltage VSS according to the second pull-down control signal DNDRV2 enabled to have a logic "high" level. The second pre-pull-down signal PD_PRE2 may be generated by the data outputted from the memory array of the semiconductor device 2 during the read operation. When both of the test operation and the read operation are not executed, the fourth input controller 264 may pull up the fourth input node ND33 to the power supply voltage VDD according to the second pull-down control signal DNDRV2 and the complementary drive termination signal OUTOFFB that have a logic "low" level. The complementary drive termination signal OUTOFFB may be set to have a logic "high" level during a predetermined period while the read operation is executed.

The second pull-down signal generator 265 may include a fourth latch unit 269 and a fourth buffer 270. The fourth latch unit 269 may receive and latch a signal of the fourth input node ND33. Further, the fourth latch unit 269 may output the latched signal through a node ND34. The fourth buffer 270 may buffer a signal of the node ND34. The fourth buffer 270 may also output the buffered signal as a second pull-down signal PD2. The second pull-down signal generator 265 may generate second first pull-down signal PD2 in response to a signal of the fourth input node ND33. If the test operation is executed, the second pull-down signal generator 265 may receive a signal of the fourth input node ND33 having a logic "low" level to generate the second pull-down signal PD2 enabled to have a logic "high" level.

The second driver 266 may include a PMOS transistor P34 and an NMOS transistor N34 electrically coupled in series between the power supply voltage VDD terminal and the ground voltage VSS terminal. The PMOS transistor P34 may pull up a second output node ND35 to the power supply voltage VDD if the second pull-up signal PUB2 inputted to the PMOS transistor P34 is enabled to have a logic "low" level. The NMOS transistor N34 may pull down the second output node ND35 to the ground voltage VSS if the second pull-down signal PD2 inputted to the NMOS transistor N34 is enabled to have a logic "high" level. If the test operation is executed, the second driver 266 may receive the second pull-up signal PUB2 having a logic "low" level to pull up the second output node ND35 to the power supply voltage VDD. Further, the second driver 266 may receive the second pull-down signal PD2 having a logic "high" level to pull down the second output node ND35 to the ground voltage VSS at the same time. If the test operation is executed, the PMOS transistor P34 acting as a pull-up element and the NMOS transistor N34 acting as a pull-down element may be simultaneously turned on.

Figure 4:
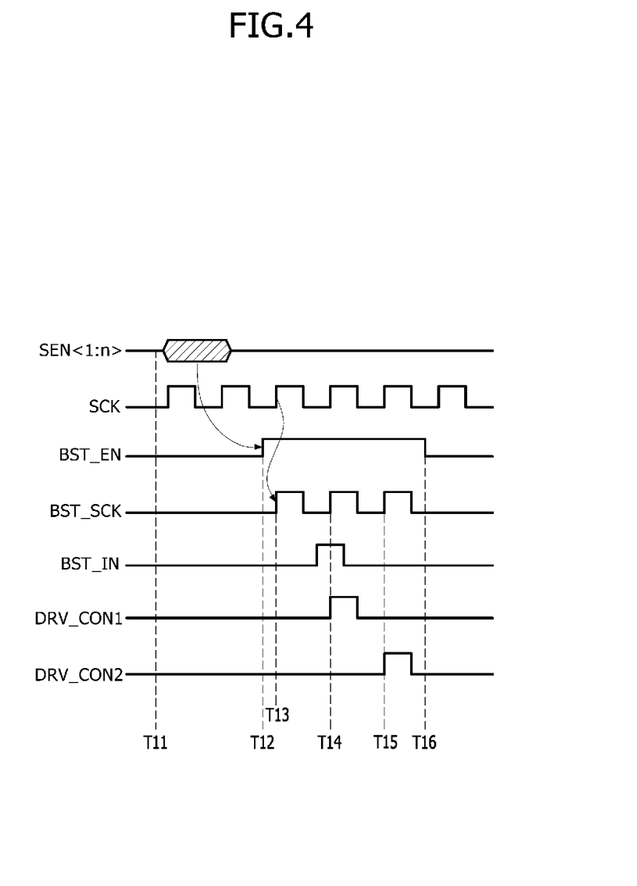
FIG. 4 is a timing diagram illustrating a test operation executed in the semiconductor system of FIG. 1.

Hereinafter, the test operation for verifying a normality/abnormality of the first output driver 24 and a normality/abnormality of the second output driver 26 will be described with reference to FIG. 4.

At time "T11," if the command signals SEN<1:n> having a predetermined logic level combination are inputted to the semiconductor device 2 to execute the test operation, the test enablement signal BST_EN and the test clock signal BST_SCK may be generated for execution of the test operation. More specifically, the test enablement signal BST_EN may be enabled to have a logic "high" level during a test period from time "T12" to time "T16." Moreover, the test clock signal BST_SCK may be generated from the clock signal SCK during the test period (T12~T16).

The test input signal BST_IN may be inputted to the semiconductor device 2 in synchronization with the test clock signal BST_SCK during the test period (T12~T16). More specifically, the test input signal BST_IN having a logic "low" level may be inputted at time "T13," the test input signal BST_IN having a logic "high" level may be inputted at time "T14,". In addition, the test input signal BST_IN having a logic "low" level may be inputted at time "T15."

If the test input signal BST_IN having a logic "high" level is inputted at time "T14," the first drive control signal DRV_CON1 may be generated to have a logic "high" level. Further, the second drive control signal DRV_CON2 may be generated to have a logic "low" level. If the first drive control signal DRV_CON1 has a logic "high" level, the first output driver 24 may pull up a voltage level of the third pad 213 to the power supply voltage VDD and may pull down a voltage level of the third pad 213 to the ground voltage VSS at the same time. In such case, the integrated circuit 1 may measure a current flowing through the fifth and sixth pads 215 and 216 to verify a normality/abnormality of the first output driver 24.

If the test input signal BST_IN having a logic "low" level is inputted at time "T15," the first drive control signal DRV_CON1 may be generated to have a logic "low" level. At time "T15," the second drive control signal DRV_CON2 may be generated to have a logic "high" level by the first drive control signal DRV_CON1 generated to have a logic "high" level at time "T14." If the second drive control signal DRV_CON2 has a logic "high" level, the second output driver 26 may pull up a voltage level of the fourth pad 214 to the power supply voltage VDD. Further, the second output driver 26 may pull down a voltage level of the fourth pad 214 to the ground voltage VSS at the same time. In such case, the integrated circuit 1 may measure a current flowing through the fifth and sixth pads 215 and 216 to verify a normality/abnormality of the second output driver 26.

As described above, the semiconductor system according to an embodiment may provide a test mode for verifying a normality/abnormality of the first output driver 24 and a normality/abnormality of the second output driver 26 according to the test input signal BST_IN. In particular, the normalities/abnormalities of the first and second output drivers 24 and 26 may be verified by executing the test mode without use of a probe test that is executed by probing the pads electrically coupled to the first and second output drivers 24 and 26.

Figure 5:
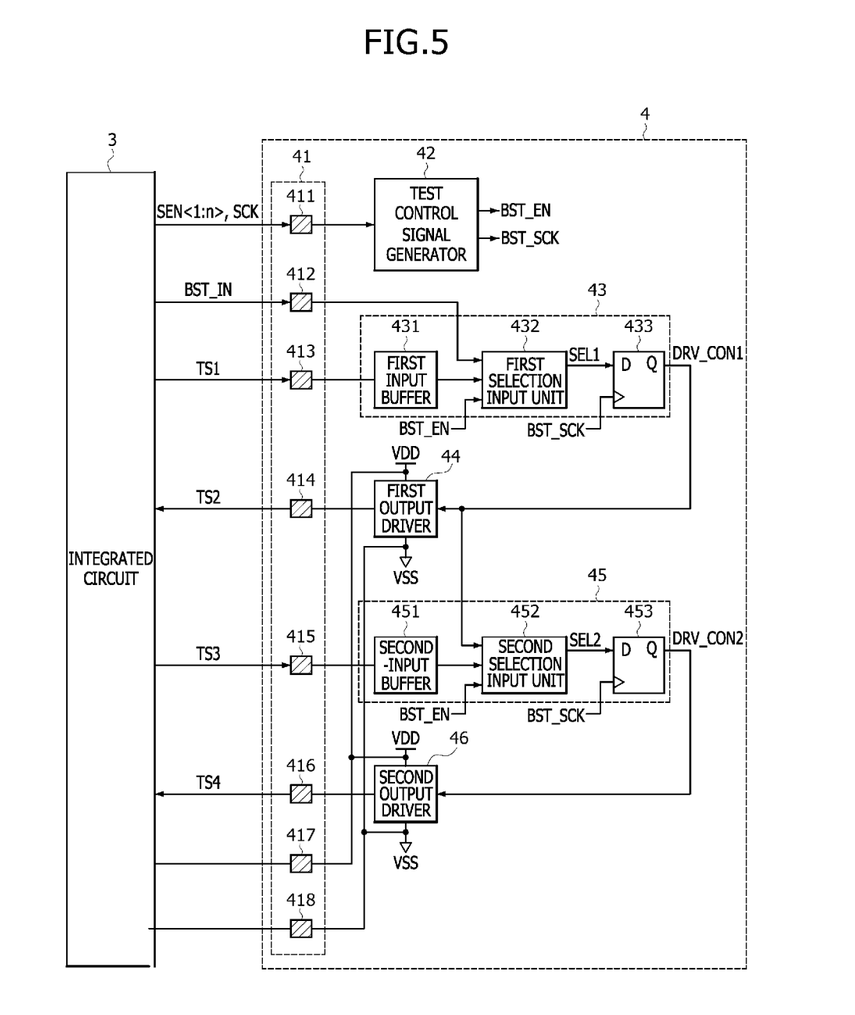
FIG. 5 is a block diagram illustrating a semiconductor system according to an embodiment of the invention.

Referring to FIG. 5, a semiconductor system according to an embodiment may be configured to include an integrated circuit 3 and a semiconductor device 4. The integrated circuit 3 may output command signals SEN<1:n>, a clock signal SCK, and a test input signal BST_IN. In addition, the integrated circuit 3 may output a first transmission signal TS1 and a third transmission signal TS3 to the semiconductor device 4. Moreover, the integrated circuit 3 may receive a second transmission signal TS2 and a fourth transmission signal TS4 from the semiconductor device 4. The semiconductor device 4 may include a pad unit 41, a test control signal generator 42, a first drive control signal generator 43, a first output driver 44, a second drive control signal generator 45, and a second output driver 46.

The pad unit 41 may include a first pad 411, a second pad 412, a third pad 413, a fourth pad 414, a fifth pad 415, a sixth pad 416, a seventh pad 417, and an eighth pad 418. The first pad 411 may receive the command signals SEN<1:n> and the clock signal SCK outputted from the integrated circuit 3. The second pad 412 may receive the test input signal BST_IN outputted from the integrated circuit 3. The first transmission signal TS1 may be transmitted from the integrated circuit 3 to the third pad 413. The second transmission signal TS2 may be transmitted from the fourth pad 414 to the integrated circuit 3. The third transmission signal TS3 may be transmitted from the integrated circuit 3 to the fifth pad 415. The fourth transmission signal TS4 may be transmitted from the sixth pad 416 to the integrated circuit 3. The seventh pad 417 may be electrically coupled to power supply voltage VDD terminals of the first and second output drivers 44 and 46. The eighth pad 418 may be electrically coupled to ground voltage VSS terminals of the first and second output drivers 44 and 46. The integrated circuit 3 may measure a current flowing through the seventh and eighth pads 417 and 418 to verify a normality/abnormality of the first output driver 44. Further, the first output driver 44 operates in response to a first drive control signal DRV_CON1. Moreover, the integrated circuit 3 may measure a current flowing through the seventh and eighth pads 417 and 418 to verify a normality/abnormality of the second output driver 46. Moreover, the second output driver 46 operates in response to a second drive control signal DRV_CON2.

The test control signal generator 42 may receive the command signals SEN<1:n> and the clock signal SCK through the first pad 411 to generate a test enablement signal BST_EN and a test clock signal BST_SCK. The test enablement signal BST_EN may be enabled to have a logic "high" level to execute a test operation capable of sequentially verifying a normality/abnormality of the first output driver 44 and a normality/abnormality of the second output driver 46. The test clock signal BST_SCK may be generated from the clock signal SCK while the test operation is executed. A logic level combination of the command signals SEN<1:n> for generating the test enablement signal BST_EN which is enabled and the test clock signal BST_SCK which is toggled may be set to be different according to various embodiments.

The first drive control signal generator 43 may include a first input buffer 431, a first selection input unit 432, and a first latch unit 433. During a read operation, the first input buffer 431 may receive the first transmission signal TS1 through the third pad 413. Further the first input buffer 431 may output the first transmission signal TS1 to the first selection input unit 432. The first selection input unit 432 may output the test input signal BST_IN received through the second pad 412 or an output signal of the first input buffer 431 as a first selection signal SEL1 according to the test enablement signal BST_EN. More specifically, the first selection input unit 432 may output the test input signal BST_IN as the first selection signal SEL1 if the test operation is executed. The first latch unit 433 may output the first selection signal SEL1 as the first drive control signal DRV_CON1 in synchronization with the test clock signal BST_SCK. The first drive control signal generator 43 may be realized to generate the first drive control signal DRV_CON1 enabled if the enabled test input signal BST_IN is inputted while the enabled test enablement signal BST_EN and the test clock signal BST_SCK are inputted in a test mode that the test operation is executed. Logic levels of the test enablement signal BST_EN and the test input signal BST_IN which are enabled may be set to be different according to various embodiments.

The first output driver 44 may be electrically coupled to the fourth pad 414. Further, an operation of the first output driver 44 may be controlled by the first drive control signal DRV_CON1. More specifically, if the first drive control signal DRV_CON1 is enabled, the first output driver 44 may pull up a voltage level of the fourth pad 414 to the power supply voltage VDD and may pull down a voltage level of the fourth pad 414 to the ground voltage VSS at the same time.

The second drive control signal generator 45 may include a second input buffer 451, a second selection input unit 452, and a second latch unit 453. During the read operation, the second input buffer 451 may receive the third transmission signal TS3 through the fifth pad 415. Further, the second input buffer 451 may output the third transmission signal TS3 to the second selection input unit 452. The second selection input unit 452 may output the first drive control signal DRV_CON1 or an output signal of the second input buffer 451 as a second selection signal SEL2 according to the test enablement signal BST_EN. More specifically, the second selection input unit 452 may output the first drive control signal DRV_CON1 as the second selection signal SEL2 if the test operation is executed. The second latch unit 453 may output the second selection signal SEL2 as the second drive control signal DRV_CON2 in synchronization with the test clock signal BST_SCK. The second drive control signal generator 45 may be realized to generate the second drive control signal DRV_CON2 enabled if the enabled first drive control signal DRV_CON1 is inputted while the enabled test enablement signal BST_EN and the test clock signal BST_SCK are inputted in a test mode that the test operation is executed.

The second output driver 46 may be electrically coupled to the sixth pad 416. Further, an operation of the second output driver 46 may be controlled by the second drive control signal DRV_CON2. More specifically, if the second drive control signal DRV_CON2 is enabled, the second output driver 46 may pull up a voltage level of the sixth pad 416 to the power supply voltage VDD and may pull down a voltage level of the sixth pad 416 to the ground voltage VSS at the same time.

The semiconductor system illustrated in FIG. 5 may have substantially the same configuration as the semiconductor system illustrated in FIG. 1 except that the first input buffer 431 and the first output buffer 44 are respectively electrically coupled to two separate pads. Further, the second input buffer 451 and the second output buffer 46 are respectively electrically coupled to two separate pads. Thus, a detailed configuration and a detailed operation of the semiconductor system illustrated in FIG. 5 will be omitted in the invention.

As described above, the semiconductor system described with reference to FIG. 5 may provide a test mode for verifying a normality/abnormality of the first output driver 44 and a normality/abnormality of the second output driver 46 according to the test input signal BST_IN. In particular, the normalities/abnormalities of the first and second output drivers 44 and 46 may be verified by executing the test mode without use of a probe test that is executed by probing the pads electrically coupled to the first and second output drivers 44 and 46.

What is claimed is:
1. A semiconductor device comprising:
   a first drive control signal generator suitable for generating a first drive control signal from a test input signal;
   a first output driver suitable for pulling up a first output node and pulling down the first output node according to the first drive control signal;
   a second drive control signal generator suitable for generating a second drive control signal from the first drive control signal; and a second output driver suitable for pulling up a second output node and pulling down the second output node according to the second drive control signal, wherein the test input signal is inputted in synchronization with a test clock signal during a test period.

2. The semiconductor device of claim 1,
wherein the first output driver includes a first pull-up element pulling up the first output node and a first pull-down element pulling down the first output node; and
wherein the first pull-up element and the first pull-down element are simultaneously turned on according to the first drive control signal.

3. The semiconductor device of claim 2,
wherein the second output driver includes a second pull-up element pulling up the second output node and a second pull-down element pulling down the second output node; and
wherein the second pull-up element and the second pull-down element are simultaneously turned on according to the second drive control signal.

4. The semiconductor device of claim 2, wherein the first output driver further includes:
a first input controller suitable for driving a first input node in response to a pull-up control signal generated from the first drive control signal, the first input node receiving a pre-pull-up signal;
a pull-up signal generator suitable for generating a pull-up signal from a signal of the first input node;
a second input controller suitable for driving a second input node in response to a pull-down control signal generated from the first drive control signal, the second input node receiving a pre-pull-down signal;
a pull-down signal generator suitable for generating a pull-down signal from a signal of the second input node; and
a first driver suitable for driving the first output node in response to the pull-up signal and the pull-down signal.

5. The semiconductor device of claim 4, wherein the pull-up control signal is generated by inversely buffering the first drive control signal and the pull-down control signal is generated by inversely buffering the pull-up control signal.

6. The semiconductor device of claim 4, wherein the first input controller pulls up the first input node if the first drive control signal is enabled.

7. The semiconductor device of claim 6, wherein the second input controller pulls down the second input node if the first drive control signal is enabled.

8. The semiconductor device of claim 1, wherein the first drive control signal generator includes:
a first selection input unit suitable for outputting the test input signal as a first selection signal in response to a test enablement signal; and
a first latch unit suitable for latching and outputting the first selection signal as the first drive control signal in response to the test clock signal.

9. The semiconductor device of claim 8, further comprising: a test control signal generator suitable for decoding command signals to generate the test enablement signal enabled to execute a test operation and suitable for generating the test clock signal from a clock signal while the test operation is executed.

10. The semiconductor device of claim 8, wherein the second drive control signal generator includes:
a second selection input unit suitable for outputting the first drive control signal as a second selection signal in response to the test enablement signal; and
a second latch unit suitable for latching and outputting the second selection signal as the second drive control signal in response to the test clock signal.

11. A semiconductor system comprising:
an integrated circuit suitable for outputting command signals, a clock signal and a test input signal and suitable for receiving or outputting a plurality of transmission signals; and
a semiconductor device suitable for sequentially generating a first drive control signal and a second drive control signal from the test input signal during a test operation executed according to the command signals and the clock signal,
wherein the semiconductor device includes a first output driver pulling up a first output node and pulling down the first output node according to the first drive control signal and a second output driver pulling up a second output node and pulling down the second output node according to the second drive control signal, wherein the test input signal is inputted in synchronization with a test clock signal during a test period.

12. The semiconductor system of claim 11,
wherein the semiconductor device further includes a first pad electrically coupled to a power supply voltage terminal and a second pad electrically coupled to a ground voltage terminal;
wherein the first output driver receives the power supply voltage and the ground voltage to operate in response to the first drive control signal; and
wherein the second output driver receives the power supply voltage and the ground voltage to operate in response to the second drive control signal.

13. The semiconductor system of claim 11,
wherein while the test operation is executed, the integrated circuit measures a current flowing through first and second pads when the first output driver operates in response to the first drive control signal and when the second output driver operates in response to the second drive control signal; and
wherein the first pad is electrically coupled to power supply voltage terminals of the first and second output drivers, and the second pad is electrically coupled to ground voltage terminals of the first and second output drivers.

14. The semiconductor system of claim 11, wherein the semiconductor device further includes a test control signal generator suitable for decoding the command signals outputted from the integrated circuit through a first pad to generate a test enablement signal enabled for execution of the test operation and suitable for generating the test clock signal from the clock signal outputted from the integrated circuit through the first pad during the test operation.

15. The semiconductor system of claim 14, wherein the semiconductor device further includes:
a first drive control signal generator suitable for receiving the test input signal outputted from the integrated circuit through a second pad to generate the first drive control signal from the test input signal; and
a second drive control signal generator suitable for generating a second drive control signal from the first drive control signal.

16. The semiconductor system of claim 15,
wherein the plurality of transmission signals includes a first transmission signal and a second transmission signal;

wherein the semiconductor device further includes a third pad receiving or outputting the first transmission signal and a fourth pad receiving or outputting the second transmission signal; and wherein the first drive control signal generator and the first output driver are electrically coupled to the third pad, and the second drive control signal generator and the second output driver are electrically coupled to the fourth pad.

17. The semiconductor system of claim 15, wherein the plurality of transmission signals includes a first transmission signal, a second transmission signal, a third transmission signal, and a fourth transmission signal;

wherein the semiconductor device further includes a third pad receiving the first transmission signal, a fourth pad through which the second transmission signal is outputted, a fifth pad receiving the third transmission signal, and a sixth pad through which the fourth transmission signal is outputted; and wherein the first drive control signal generator is electrically coupled to the third pad, the first output driver is electrically coupled to the fourth pad, the second drive control signal generator is electrically coupled to the fifth pad, and the second output driver is electrically coupled to the sixth pad.

18. The semiconductor system of claim 17, wherein the second drive control signal generator includes:

a selection input unit suitable for outputting the first drive control signal as a selection signal in response to the test enablement signal; and a latch unit suitable for latching and outputting the selection signal as the second drive control signal in response to the test clock signal.

19. The semiconductor system of claim 11, wherein the first output driver includes a first pull-up element pulling up the first output node and a first pull-down element pulling down the first output node; and wherein the first pull-up element and the first pull-down element are simultaneously turned on in response to the first drive control signal.

20. The semiconductor system of claim 19, wherein the first output driver further includes:

a first input controller suitable for driving a first input node in response to a pull-up control signal generated from the first drive control signal, the first input node receiving a pre-pull-up signal;

a pull-up signal generator suitable for generating a pull-up signal from a signal of the first input node;

a second input controller suitable for driving a second input node in response to a pull-down control signal generated from the first drive control signal, the second input node receiving a pre-pull-down signal;

a pull-down signal generator suitable for generating a pull-down signal from a signal of the second input node; and a first driver suitable for driving the first output node in response to the pull-up signal and the pull-down signal.

21. The semiconductor system of claim 20, wherein the pull-up control signal is generated by inversely buffering the first drive control signal and the pull-down control signal is generated by inversely buffering first pull-up control signal.

22. The semiconductor system of claim 20, wherein the first input controller pulls up the first input node if the first drive control signal is enabled.

23. The semiconductor system of claim 20, wherein the second input controller pulls down the second input node if the first drive control signal is enabled.

24. The semiconductor system of claim 11, wherein the second output driver includes a second pull-up element pulling up the second output node and a second pull-down element pulling down the second output node; and wherein the second pull-up element and the second pull-down element are simultaneously turned on in response to the second drive control signal.

25. A semiconductor device comprising:

a first drive control signal generator configured to output a first selection signal generated from a test input signal as a first drive control signal in synchronization with a test clock signal;

a first output driver electrically coupled to a first pad and configured to have an operation pulling up a first output node and pulling down the first output node according to the first drive control signal;

a second drive control signal generator configured to generate a second drive control signal in response to the first drive control signal when a test enablement signal and the test clock signal are inputted; and a second output driver electrically coupled to a second pad and configured to have an operation pulling up a second output node and pulling down the second output node according to the second drive control signal, wherein the test input signal is inputted in synchronization with a test clock signal during a test period.

* * * * *